United States Patent [19]
Schaefer

[11] 3,958,183
[45] May 18, 1976

[54] FREQUENCY SELECTIVE SIGNAL PRESENCE DETECTOR

[75] Inventor: Dietrich H. Schaefer, Marion, Iowa

[73] Assignee: Rockwell International Corporation, El Segundo, Calif.

[22] Filed: Feb. 13, 1975

[21] Appl. No.: 549,587

[52] U.S. Cl. .............................. 328/138; 328/115; 328/140
[51] Int. Cl.² ......................................... H03D 3/02
[58] Field of Search ............ 328/138, 141, 140, 115

[56] References Cited
UNITED STATES PATENTS

| | | |
|---|---|---|
| 3,458,823 | 7/1969 | Nordahl .......................... 328/141 X |
| 3,757,233 | 9/1973 | Dixon ................................ 328/138 |
| 3,825,842 | 7/1974 | Birchfield et al. .................. 328/138 |
| 3,845,399 | 10/1974 | Cardon et al. ..................... 328/138 |

Primary Examiner—John S. Heyman
Attorney, Agent, or Firm—Terry M. Blackwood; Robert J. Crawford

[57] ABSTRACT

A signal presence detector selective over at least a frequency range of $F_L$ to $F_H$. The detector includes timing signal generating means, clock signal generating means, and means responsive to both of these for providing, in a predetermined manner, a time window following each timing indication. Also included is means for detecting time coincidence between certain time windows and certain timing indications.

14 Claims, 6 Drawing Figures

FREQUENCY SELECTIVE SIGNAL PRESENCE DETECTOR

The invention herein described was made in the course of or under a contract or subcontract thereunder with The Department of the Air Force.

This invention relates generally to signal detection and more particularly to detecting whether signals of predetermined frequencies are present at a receiving location.

Conventionally, to detect the presence of a signal of given frequency, a received signal, or some component thereof, is passed through a band-pass filter to a full-wave rectifier and then on to an amplitude comparator. If high Q filters are employed, as is many times required when the signal spectrum is dense or crowded, this approach can be relatively slow because several cycles may be required to produce a reliable indication. For instance, depending on the type of input signal, an unwanted oscillatory response (i.e., ringing) may be produced which takes several cycles to adequately subside.

It is an object of this invention to provide signal detection apparatus which overcomes the aforementioned difficulties. This and other objects, features, and advantages of the invention will become more apparent upon reference to the following specifications, claims, and appended drawings in which:

Figure 1:
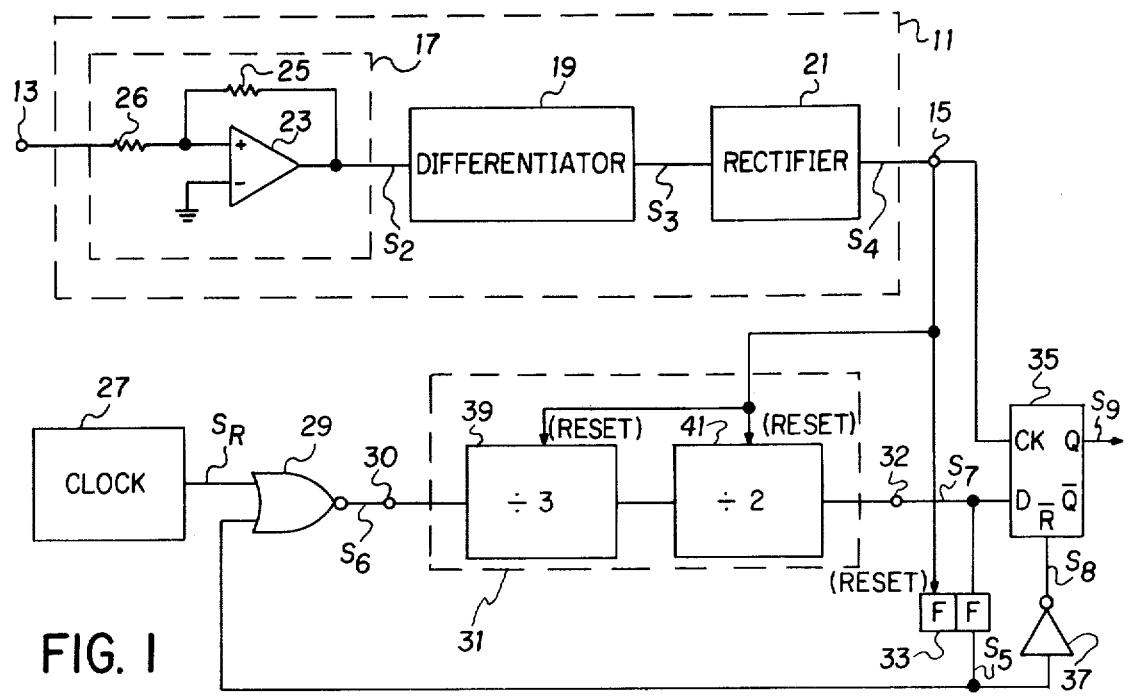
FIG. 1 is a block diagram representing the presently preferred embodiment of the invention.

In the presently preferred embodiment illustrated in FIG. 1, the apparatus of this invention is tailored for application in a TACAN receiving system to detect the presence of either 15 hertz or 135 hertz signals. As is well known in the art, signals at these two frequencies are employed in TACAN systems to provide aircraft bearing information. However, as will become more apparent hereinbelow, the principles of the present invention are not limited to this specific application or embodiment.

In the apparatus of FIG. 1, timing signal generator 11, in response to an amplitude varying input signal $S_1$ at input terminal 13, provides a series of timing indications at terminal 15. Timing signal generator 11 comprises an amplitude comparator 17, a differentiator 19, and a rectifier 21 serially connected between terminals 13 and 15 in the stated order. In the above-mentioned preferred application, input signal $S_1$ constitutes a detected IF signal preconditioned for application to input terminal 13. In particular, the detected IF signal (from receiver and amplitude detector apparatus not shown), in order to eliminate or reduce nuisance signals, is passed through a conventional band-pass filter (not shown) of relatively wide bandwidth and low Q. In this manner, nuisance signals are substantially reduced without substantially deteriorating or interfering with the signal whose presence or absence it is desired to detect. In the preferred application, this band-pass filter is centered at the frequency being sought (i.e., 15 hertz or 135 hertz), has 3 db bandwidth of about ½ $f_o$, and Q of about 2, where $f_o$ equals the frequency sought. Any further reduction in the bandwidth of the filter would result in unfavorable phase shifts of the desired signal as the frequency of the desired signal changes over its specified limits.

Comparator 17 is hysteretic and may comprise any of several well-known circuits. Its operation is substantially identical to that of a Schmidt trigger and in the preferred embodiment comprises an op amp 23 whose inverting input is grounded and whose output is coupled back through resistor 25 to the noninverting input there to combine with the input signal. As is well known in the art, such feedback establishes positive and negative thresholds and the value of resistors 25 and 26 determine the amplitude of these thresholds. Also, in the preferred embodiment, so as to prevent any possibility of multiple timing indications occurring during comparator output transitions, the differentiator time constant is longer than the greater one of the comparator rise and fall times. Although, as will later be seen, rectifier 21 may be a full wave rectifier so as to achieve a different frequency scale factor, in the preferred embodiment the differentiator output is half-wave rectified to provide one timing pulse per cycle of a sinusoidal input signal $S_1$.

Figure 2:
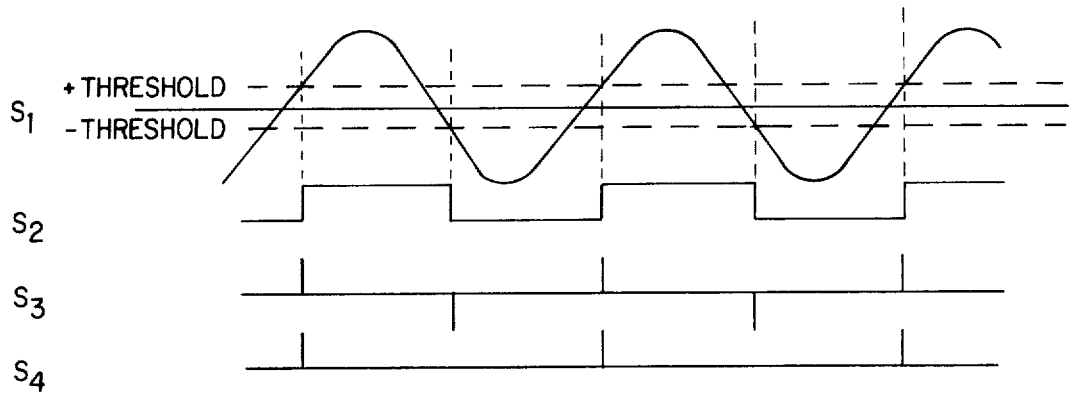
FIGS. 2, 3 and 4 illustrate waveforms useful in explaining the operation of the apparatus of FIG. 1.
Figure 3:
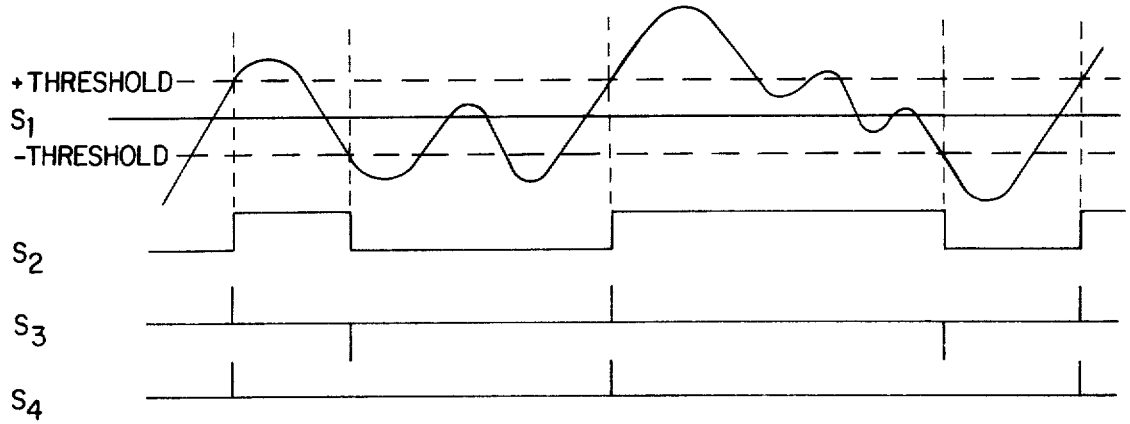

FIGS. 2 and 3 illustrate the responses of the comparator 17, the differentiator 19, and the rectifier 21, ($S_2$, $S_3$, $S_4$ respectively) to two different input signals $S_1$ appearing at the comparator input. As is seen from these two examples, the comparator provides a rectangular shaped output $S_2$ in response to its more slowly varying input $S_1$. The leading and trailing edges of the comparator output $S_2$ are marked by occurrences at which signal $S_1$, having exceeded a threshold of one polarity, reverses polarity an odd number of times and then first exceeds the other threshold. As seen from FIG. 3, the inclusion of this hysteresis characteristic (i.e. nonzero thresholds) is desirable because it prevents a good deal of nuisance triggering by signal components which are not being sought but which may still be present in the filtered composite signal at the comparator input. The output signal $S_3$ of differentiator 19 is a series of pulses of alternating polarity, those of positive polarity occurring at leading edges of $S_2$ and those of negative polarity occurring at trailing edges of $S_2$. Rectifier 21 eliminates the negative pulses of $S_3$. (See $S_4$.)

In either example, the preferred timing signal $S_4$ comprises a series of positive pulses each of which occur when the signal $S_1$, having exceeded the negative threshold, reverses polarity (i.e. becomes positive) and first exceeds the positive threshold. It should be apparent that, although in this preferred embodiment, individual timing indications comprise pulses, the form of the timing indication is not important. For instance, depending on the particular circuitry being driven, $S_2$ could be used as the timing signal; i.e., $S_2$ contains at least the basic timing information and each leading edge could serve as a timing indication.

Returning now to FIG. 1, it is further seen that the output of clock source 27 is coupled to one input of NOR gate 29 whose output is in turn coupled via terminal 30 to the clock input of counter circuit 31. The output of counter circuit 31 is coupled via terminal 32 to the clock input of flip-flop 33 and also to the D input of the D flip-flop 35. The output of flip-flop 33 is coupled to the second input of NOR gate 29 and also, via inverter 37, to the R input of D flip-flop 35. Counter circuit 31 comprises a sequence of flip-flops appropriately coupled to form a divide-by-3 frequency divider 39 followed by a divide-by-2 frequency divider 41. Via connection to terminal 15, timing signal $S_4$ is provided at the clock input of the D flip-flop 35, at the reset inputs of dividers 39 and 41, and at the reset input of flip-flop 33. Clock source 27 generates a series of clock indications regularly spaced at $T_R$ and preferably comprises a sinusoidal or square-wave signal generator providing a stable frequency $F_R$ where $F_R = 1/T_R$. In the preferred embodiment, $F_R$ is four times the frequency of the signal whose presence or absence it is desired to detect. That is, for the 15 hertz and 135 hertz applications, $F_R$ is respectively 60 hertz and 540 hertz. To briefly describe the operation of the FIG. 1 apparatus, assume first that the output of flip-flop 33 is high. (The terms low and high are used herein to designate the logic condition 0 and 1.) In this disable condition, the output of NOR gate 29 is forced low, all inputs to the D flip-flop are overridden and the Q output of D flip-flop 35 is forced low. At the next timing indication, termed for descriptive purposes as a first timing indication, the output of flip-flop 33 is driven low, removing the disable condition, and the outputs of dividers 39 and 41 are driven low, i.e., the count is reset to zero. At the third clock indication following this first timing indication and assuming a second timing indication does not intervene, the output of divider 41 goes high and remains so until the sixth clock indication at which time such output goes low. As the output of the divider 41 goes low, flip-flop 33 output goes high and reestablishes the disable condition which exists until the next timing indication. Should a second timing indication occur while the output of divider 41 is high, the Q output of D flip-flop 35 goes high and thus indicates signal presence. Should a second timing indication occur prior to the third clock indication or subsequent to the sixth clock indication, i.e., while the output of divider 41 is low, the Q output of D flip-flop 35 remains low and thus indicates signal absence.

Figure 4:
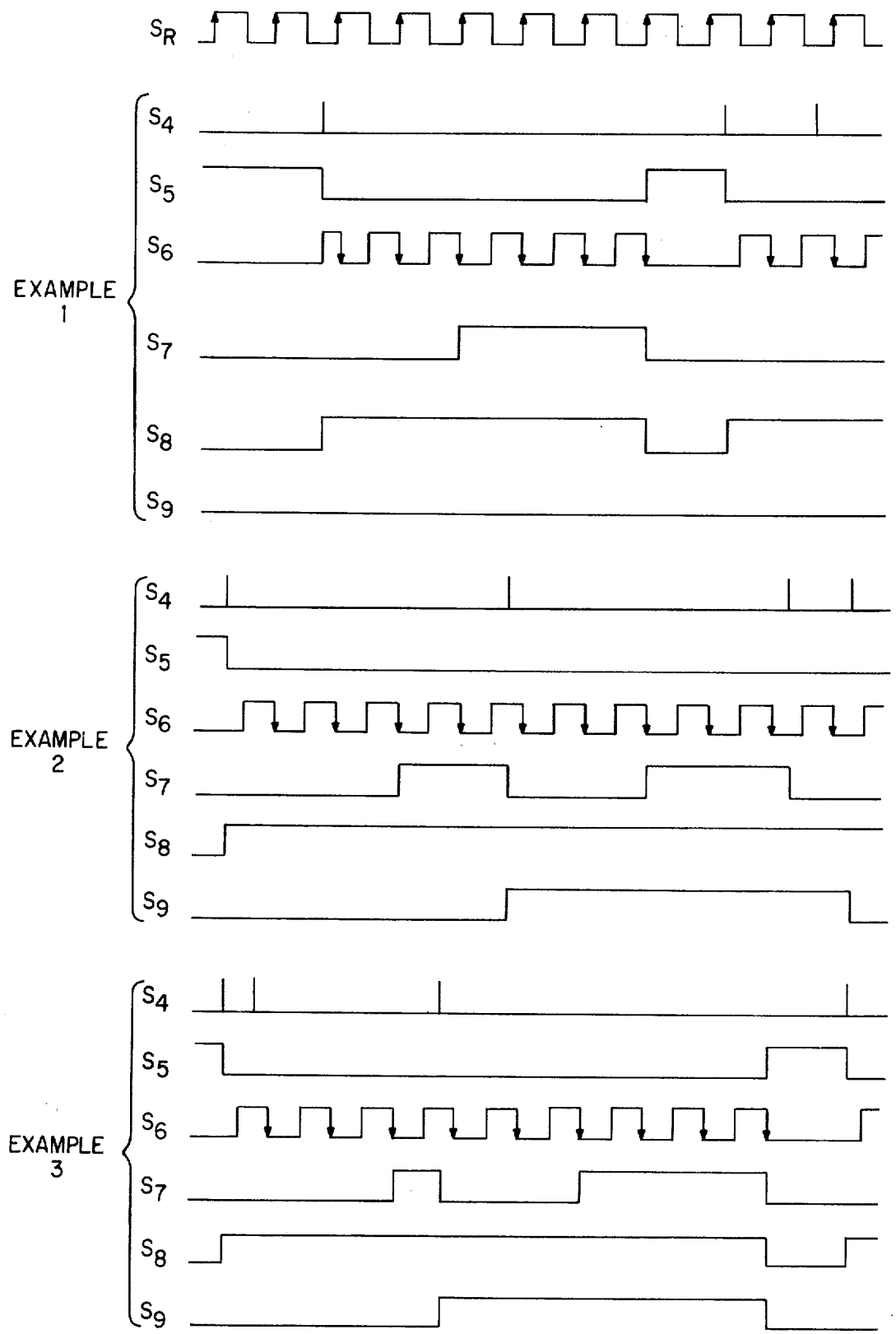

For a more detailed description of the operation of the FIG. 1 apparatus, reference will now be made to FIG. 4 which illustrates the waveform responses of the digital circuitry to three different timing signals. The output signals of the clock source 27, the flip-flop 33, the NOR gate 29, the divider 41, and the inverter 37 will be referred to respectively as $S_R$, $S_5$, $S_6$, $S_7$, and $S_8$. The Q output signal of the D flip-flop is $S_9$. As before, $S_4$ is the timing signal. In FIG. 4, although the $S_R$ waveform is presented only once, it is considered a part of each example. Moreover the frequency $F_R$ of $S_R$ is presumed to be 60 hertz and the leading edges of $S_R$, shown as a square wave, comprise the individual clock indications.

Turning now to example 1 of FIG. 4, the output of flip-flop 33, $S_5$, is shown high preceding the occurrence of the first timing indication of $S_4$. With $S_5$ high, NOR output signal $S_6$ is forced low. Also, inverter output signal $S_8$ is forced low which in turn overrides all other D flip-flop inputs and forces the Q output signal $S_9$ low. Moreover, since $S_5$ is high and since it can only assume such a condition following a transition of divider output signal $S_7$ from high to low, $S_7$ must be low as shown. At the first timing indication of $S_4$, flip-flop 33 is reset and $S_5$ goes low. This forces $S_8$ high and enalbes D flip-flop to operate on its other inputs. With $S_5$ low NOR gate 29 is permitted to respond to $S_R$ and thus $S_6$, subsequent to the first timing indication, appears as an inversion of $S_R$. Also, the timing indication resets dividers 39 and 41 so that, if it were not already so, the count is set to zero.

At the third clock indication following the first timing indication, divider 41 output signal $S_7$ goes high and, since the second timing indication has not yet occurred, at the sixth clock indication goes low. As $S_7$ goes low, $S_5$ goes high and reinstitutes the disable or override condition by forcing both $S_6$ and $S_8$ low.

At the second timing indication of $S_4$ circuit resetting and reenabling occur as above described for the first timing indication, and $S_6$ again starts to track (in inverted fashion) $S_R$. In contrast with the above-described events occurring between the first and second timing indications, there is only one clock indication between the second and third timing indications, and consequently, $S_7$ makes no low to high to low transitions, $S_5$ remains low, $S_6$ continues in response to $S_R$, and $S_8$ remains high. Thus, except for the resetting of dividers 39 and 41 to a count of zero, there is little change at the third timing indication.

It should be noted that since $S_4$ and $S_7$ are never simultaneously high, $S_9$ remains low throughout the example, indicating absence of the desired or sought-for signal. It should also be noted as an indication of the frequency selective nature of the FIG. 1 apparatus, that the interval between timing indications 1 and 2 and the interval between timing indications 2 and 3 are respectively 6.5 $T_R$ and 1.5 $T_R$. These intervals for $T_R = 1/F_R = 1/(60$ hertz$)$ correspond to frequencies of 9.23 hertz and 40 hertz respectively.

Examples 2 and 3, especially in view of the above detailed description, should be self-explanatory, and thus, in the interest of conciseness, emphasis will now be placed on differences in operation and other points deserving special observation.

Turning now to example 2, it is seen that the first high signal state of $S_7$ begins at the third clock indication following the first timing indication. Since the second timing indication occurs between the third and sixth clock indications (i.e., the maximum interval in the preferred embodiment during which $S_7$ may remain high), the second timing indication and the first high signal state of $S_7$ are time coincident and thus $S_9$ goes high to indicate presence of the sought-for signal. It should also be pointed out that although divider 41 is reset to zero at the second timing indication, there is sufficient delay in the resetting to permit the Q output to register the high signal state present at the D input (i.e., the high signal state of $S_7$) just prior to the transition or resetting of $S_7$ from high to low. Since flip-flop 33 is reset at the same time $S_7$ goes from high to low the output of flip-flop 33 remains low, thus keeping $S_8$ high and $S_6$ continuing.

Continuing now in time sequence, a second high signal state of $S_7$ begins at the third clock indication following the first timing indication, and a third timing indication occurs between the third and sixth clock indications. Since there is time coincidence between the third timing indication and the second high signal state of $S_7$, $S_9$, already high, remains high. At the fourth timing indication, due to an insufficient time interval between the third and fourth timing indications, a third high signal state of $S_7$ does not develop. Thus, since there is no time coincidence of the fourth timing indication and a third high signal state of $S_7$, $S_9$ goes low. Stated another way, the low signal present at the D input appears at the Q output at the occurrence of the fourth timing indication.

As further indication of the frequency selectivity, it should be noted that the interval between the first and second timing indications (also the second and third) is 4.5 $T_R$. For $T_R = 1/F_R = 1(60$ hertz), 4.5 $T_R$ corresponds to a frequency of 13.33 hertz. The interval between the third and fourth timing indications is $1T_R$ and thus corresponds to a frequency of 60 hertz.

In example No. 3, $s_9$ remains low until, as above described, there is time coincidence between a timing indication and the next preceding high signal state of $S_7$. Thus $S_9$ remains low until the third timing indication, at which time $S_9$ goes high. Since the fourth timing indication does not occur until after the next preceding high signal state of $S_7$ has expired (i.e., until after $S_7$ has returned to a low signal state) $S_9$ in response to $S_8$ going low, goes low at the sixth clock indication following the third timing indication.

It should be noted that the interval between the second and third timing indications is $3T_R$ which corresponds, for $T_R = 1/F_R = 1/(60$ hertz), to a frequency of 20 hertz.

From the foregoing description of the FIG. 1 apparatus and its operation, it should be apparent that following each timing indication by a predetermined delay, there is a predetermined span of time, hereinbelow referred to as a time window, during which it is possible for a test signal ($S_7$ in the preferred embodiment) to take on a different state or appearance. Each time window is independent of the actual state of the test signal and is independent of the succeeding timing indication. Thus defined, there are, for a given number of timing indications, the same number of time windows, each time window being associated with and following, in a predetermined manner, a particular timing indication. If during any particular time window, the timing indication succeeding the one with which the time window is associated coincides with this particular time window, an indication is provided that the sought-for signal is present. If there is no time coincidence between the aforesaid timing indication and time window, an indication is provided that the sought-for signal is absent. Stated another way, for X number of timing indications, the individual timing indications may be designated at $TI_1$, $TI_2$, ... and so on through $TI_X$. Following and associated respectively with the timing indications are time windows $TW_1$, $TW_2$, ... and so on through $TW_X$. When any time window $TW_j$ coincides in time with timing indication $TI_{j+1}$, presence of the sought-for signal is indicated. When any time window $TW_j$ does not coincide in time with timing indication $TI_{j+1}$, absence of the sought-for signal is indicated.

For the preferred embodiment, each time window begins and ends respectively at the third and sixth clock indications following a timing indication. Thus even though the timing indications and clock indications are asynchronous, if the intervals between timing indications are not less than $3T_R$ and not greater than $5T_R$, each timing indication will coincide with a proper time window. That is, for time intervals, between timing indications, ranging from $3T_R$ to $5T_R$, the apparatus of FIG. 1 will always provide an indication that the sought-for signal is present. Stated in terms of frequency for the 15 hertz seeking application where $F_R$ is 60 hertz, presence is always indicated for timing signal frequencies between 12 hertz and 20 hertz. Likewise, for the 135 hertz seeking application where $F_R$ is 540 hertz, presence is always indicated for timing signal frequencies between 108 hertz and 180 hertz.

It should be pointed out that presence can occasionally be indicated for timing signal frequencies as low as $1/(6T_R)$ and as high as $1/(2T_R)$. This is because the clock indications and the timing indications are not synchronous. Due to this random relationship, it is thus possible for a time window to begin as early as $2T_R$ or end as late as $6T_R$ as measured from its associated timing indication. However, such presence indications are not continuous. This is, even for a continuous timing signal whose frequency is between 10 and 12 hertz or between 20 and 30 hertz, $S_9$ in the 15 hertz application will fluctuate between high and low states. For timing signal frequencies anywhere within the 12 to 20 hertz boundaries, presence is always and continuously indicated; and for timing signal frequencies anywhere outside the 10 to 30 hertz boundaries, absence is always and continuously indicated. Analogously, such boundaries in the 135 hertz application are 108 to 180 hertz, and 90 to 270 hertz.

It should also be appreciated that during the temporary disablement condition [which obtains if a second timing indication (i.e., $TI_{j+1}$) does not occur prior to the expiration of a first time window (i.e., $TW_j$) and which exists until a second timing indication does occur] counter circuit 31 is temporarily prevented from responding to clock indications beyond the sixth. Moreover, D flip-flop 35 is temporarily barred during this condition from registering high at the Q output; i.e., barred from registering signal presence. Thus the temporary disablement condition assures that there is only one associated time window per timing indication.

As earlier mentioned, various modifications may be made to the preferred embodiment without departing from the inventive teachings herein. For example, practically any range of frequency selectivity may be achieved with appropriate modifications to the apparatus of FIG. 1. For instance if, instead of say the 12 to 20 hertz range, it is desired to detect the presence of input signals having frequency within a general range of $F_L$ to $F_H$, then, assuming there is one timing indication per cycle of input signal, each time window should open no later than $T_H = 1/F_H$, and close no earlier than $T_L = 1/F_L$, as measured from its associated timing indication.

Figure 5:
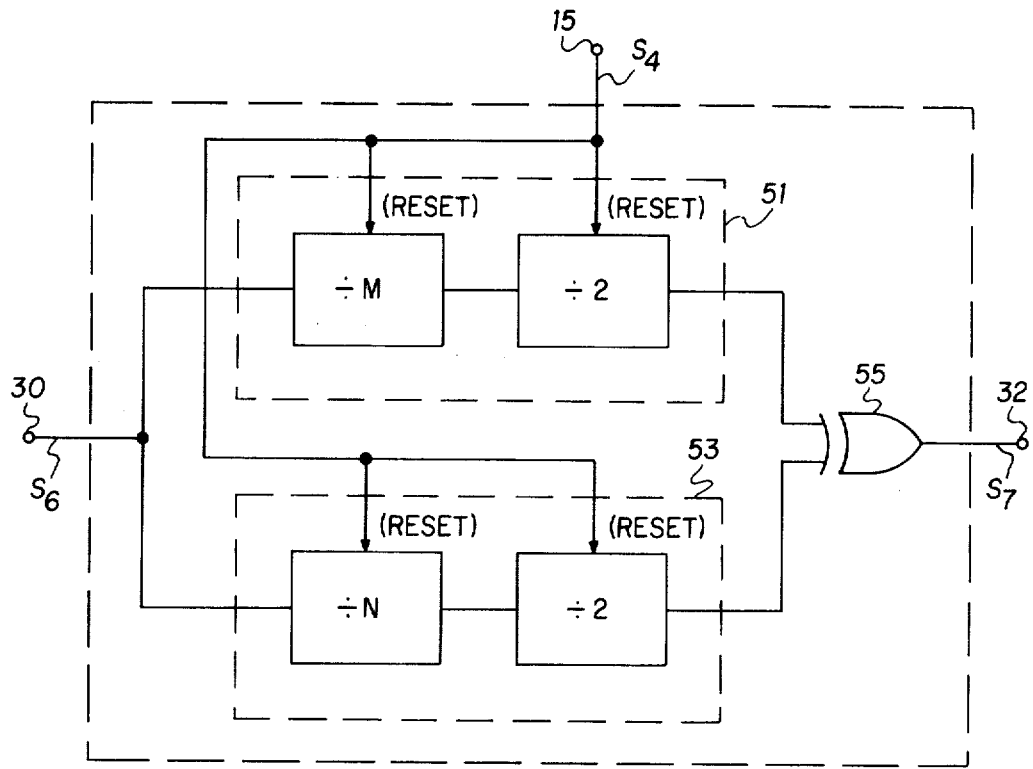
FIGS. 5 and 6 illustrate two different embodiments of apparatus substitutable for a certain portion of FIG. 1.

This generalized time window may be provided by substituting the apparatus of FIG. 5 for the counter circuit 31 of FIG. 1. As indicated in FIG. 5, each of two divider networks 51 and 53 receive as an input signal via terminal 30 the output signal $S_6$ of NOR gate 29. Divider network 51 comprises a divide by m followed by a divide by 2. Divider network 53 comprises a divide by n followed by a divide by 2. (m and n are used herein to represent non-zero positive numbers, and m is less than n.) The outputs of divider networks 51 and 53 are coupled to the inputs of EXCLUSIVE OR gate 55. The EXCLUSIVE OR gate output is coupled to terminal 32 and provides a test signal $S_7$ to D flip-flop 35 and flip-flop 33. Timing signal $S_4$ is coupled from terminal 15 to the reset inputs of divider networks 51 and 53.

Following an associated timing indication, and assuming a succeeding timing indication does not intervene, the output signal of the 2m divider network 51 goes high at the mth clock indication and the output signal of the 2n divider network 53 goes high at the nth clock indication. EXCLUSIVE OR gate output signal $S_7$ goes high at the mth clock indication and goes low at the nth clock indication. It is thus seen that, as with the FIG. 1 embodiment, there is a time span during which it is possible for $S_7$ to change state and thus a time window follows each timing indication. In this instance, the time window opens at the mth clock indication and closes at the nth clock indication.

It should be apparent that the values of $m$ and $n$ are dependent, not only upon $F_L$ and $F_H$ but also upon clock frequency $F_R$ which, of course, need not be 60 hertz or 540 hertz, as employed in the preferred application. Continuing with the assumption that the timing signal $S_4$ provides one timing indication per cycle of input signal, $m$ and $T_R$ should preferably be valued such that $mT_R$ is equal or slightly less than $T_H$, and $n$ and $T_R$ should preferably be valued such that $(n-1)T_R$ is equal or slightly greater than $T_L$. For the sake of accuracy, it is, of course, preferable that $mT_R = T_H = 1/F_H$ and $(n-1)T_R = T_L = 1/F_L$, but a time window opening slightly earlier than $T_H$ and closing slightly later than $T_L$ will at least cover the intended frequency range of $F_L$ to $F_H$. Of course some trade-offs and approximations of these relationships may be necessary depending on the available values of $m$, $n$, and $F_R$.

Figure 6:
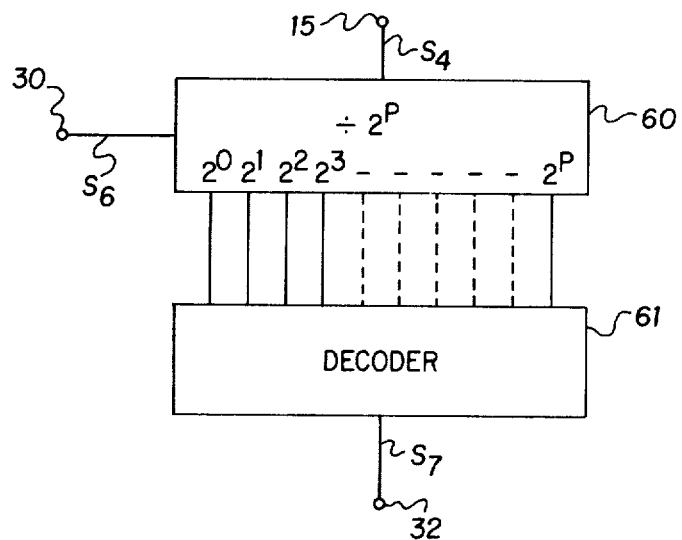

The aforesaid generalized time window may also be accomplished by substituting the apparatus of FIG. 6 for the counter circuit 31 of FIG. 1. As indicated in FIG. 6 the counter or divider network 60 comprises a binary divider of P bits and receives as an input signal via terminal 30 the output signal of NOR gate 29. Each of the divider outputs $2^0, 2^1, 2^2, 2^3, \ldots$ and so on through $2^P$ is connected to decoder 61. Decoder 61 output is coupled to terminal 32 and provides a test signal $S_7$ to D flip-flop 35 and flip-flop 33. Timing signal $S_4$ is coupled from terminal 15 to the reset input of divider network 60.

To generalize, decoder 61 is implemented such that, following an associated timing indication into the divider reset input, decoder output signal $S_7$ goes high at the mth clock indication and goes low at the nth clock indication. Thus the output versus input characteristic (i.e., the "transfer function") for the FIG. 6 apparatus is the same as that for the FIG. 5 apparatus. Specific implementations of decoder 61 for achieving specific values of $m$ and $n$ will be apparent to those skilled in the art. Several approaches, including comparison with stored binary words, are available. It should also be apparent that $n$ should be $2^P$.

It should be noted that for the FIG. 5 embodiment $2m$ should be no less than $n$ so that the $2m$ divider output signal does not go low prior to the $2n$ divider output signal going high. For the FIG. 6 apparatus there is no such interdependence of the $m$ and $n$.

It should further be noted that operational accuracy may be improved by increasing the clock frequency $F_R$ in relation to the frequencies being sought. As $F_R$ increases, $T_R$ of course decreases and in many cases the values $mT_R$ and $(n-1)T_R$ can approach more nearly the desired values of $T_H$ and $T_L$ respectively. Moreover, as $T_R$ decreases, the one $T_R$ inaccuracy that is due, as mentioned earlier, to the asynchronous relationship of $S_4$ and $S_7$, becomes less significant. That is, for decreased $T_R$, frequency ranges in which the presence signal fluctuates (such as the 10 to 12 hertz and 20 to 30 hertz ranges for the 60 hertz application) are reduced accordingly.

Although in embodiments heretofore described, it has been assumed that the timing signal frequency is the same as the input signal frequency (i.e., one timing indication per cycle of input) other frequency scaling factors may readily be achieved such that the frequency of $S_4$ is C times the input frequency $F_X$ where C 1. For instance, by making the rectifier 21 of FIG. 1 a full-wave rectifier instead of a half-wave rectifier, the frequency of $S_4$, for an input frequency of $F_X$, would be $CF_X$ where $C = 2$. Of course for C other than 1, appropriate changes are required in the time windows. More particularly, each time window as measured from its associated timing indication should open no later than $T_H/C$ and close no earlier than $T_L/C$. Moreover, for the FIG. 5 embodiment, $mT_R$ should preferably be equal to or slightly less than $T_H/C$, and $(n-1)T_R$ should preferably be equal to or slightly greater than $T_L/C$.

Thus, while particular embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

What is claimed is:

1. A signal presence detector selective over at least a frequency range of a first frequency $F_L$ to a second frequency $F_H$ where $F_H \geq F_L$, said signal presence detector comprising:
   a. first means comprising means responsive to amplitude variations in an input signal for developing a timing signal comprising a series of timing indications whose occurrences are dependent at least upon the amplitude of the input signal such that for a sinusoidal input signal of frequency $F_X$ the frequency of said timing signal is $CF_X$ where C is a predetermined scale factor;
   b. second means comprising means for generating a periodic clock signal comprising a series of clock indications; and
   c. third means comprising means responsive to said timing indications and said clock indications for (i) providing a time window following and associated with each timing indication, each of said time windows, as measured in time from its associated one of said timing indications, opening no later than $T_H/C$ and closing no earlier than $T_L/C$, where $T_H$ and $T_L$ are respectively equal to $1/F_H$ and $1/F_L$, and (ii) detecting time coincidence between a first time window and a second timing indication, said first time window being associated with a first timing indication and said second timing indication comprising the timing indication succeeding said first timing indication.

2. A signal presence detector as defined in claim 1 wherein $C = 2$.

3. A signal presence detector as defined in claim 2 wherein said first means comprises means for (i) establishing two thresholds of opposite polarities, and (ii) providing in response to an input signal variable in amplitude and polarity, a timing signal comprising a series of timing indications, each said timing indication occurring when said input signal, having exceeded either threshold, reverses polarity an odd number of times and first exceeds the other threshold.

4. A signal presence detector as defined in claim 1 wherein $C = 1$.

5. A signal presence detector as defined in claim 4 wherein said first means comprises means for (i) establishing first and second thresholds of opposite polarities, and (ii) providing, in response to an input signal variable in amplitude and polarity, a timing signal comprising a series of timing indications, each said timing indication occurring when said input signal, having exceeded said first threshold, reverses polarity an odd number of times and first exceeds said second threshold.

6. A signal presence detector as defined in claim 1 wherein each said time window opens and closes respectively at a clock indication number m and a clock indication number n following the timing indication with which the time window is associated, where m and n are first and second numbers such that $mT_r$ ($T_H/C$), (n-1)$T_R$ ($T_L/C$), and $T_R$ is the period of said clock signal, and said third means includes binary counter means for establishing $m$ and $n$.

7. A signal presence as defined in claim 6 wherein C = 1.

8. A signal presence detector as defined in claim 6 wherein C = 2.

9. A signal presence detector as defined in claim 1 wherein each said time window opens and closes respectively at a clock indication number m and a clock indication number $n$ following the timing indication with which the time window is associated, where m and n are first and second numbers such that $mT_R$ is approximately equal to ($T_H/C$), (n-1)$T_R$ is approximately equal to ($T_L/C$), and $T_R$ is the period of said clock signal, and said third means includes binary counter means for establishing $m$ and $n$.

10. A signal presence detector as defined in claim 9 wherein C = 1.

11. A signal presence detector as defined in claim 9 wherein C = 2.

12. A signal presence detector as defined in claim 1 including means for temporarily disabling said third means if said second timing indication does not occur prior to the expiration of said first time window, said temporary disablement existing until the occurrence of the second timing indication, at which occurrence said third means is re-enabled, and said temporary disablement assuring that only one time window is provided per associated timing indication.

13. A signal presence detector as defined in claim 12 wherein C = 1.

14. A signal presence detector as defined in claim 12 wherein C = 2.

* * * * *